(12) United States Patent
Chang

(10) Patent No.: US 9,625,788 B2
(45) Date of Patent: Apr. 18, 2017

(54) FLASH ILLUMINATION DEVICE FOR USE WITH ELECTRONIC APPARATUS OR MOBILE DEVICE

(71) Applicant: Michael Chau-Lun Chang, Taipei (TW)

(72) Inventor: Michael Chau-Lun Chang, Taipei (TW)

(*) Notice: Subject to any disclaimer, the term of this patent is extended or adjusted under 35 U.S.C. 154(b) by 9 days.

(21) Appl. No.: 14/715,616

(22) Filed: May 19, 2015

(65) Prior Publication Data

US 2016/0342070 A1    Nov. 24, 2016

(51) Int. Cl.
| | |
|---|---|
| *G03B 15/05* | (2006.01) |
| *F21L 4/02* | (2006.01) |
| *F21L 4/08* | (2006.01) |
| *F21V 23/02* | (2006.01) |
| *F21V 23/04* | (2006.01) |
| *H01L 51/50* | (2006.01) |
| *F21Y 101/02* | (2006.01) |

(52) U.S. Cl.
CPC .............. *G03B 15/05* (2013.01); *F21L 4/02* (2013.01); *F21L 4/08* (2013.01); *F21V 23/023* (2013.01); *F21V 23/045* (2013.01); *F21V 23/0414* (2013.01); *H01L 51/504* (2013.01); *F21Y 2101/02* (2013.01)

(58) Field of Classification Search
CPC .... G03B 15/05; F21L 4/02; F21L 4/08; F21V 23/023; F21V 23/0414; F21V 23/045; H01L 51/504
See application file for complete search history.

(56) References Cited

U.S. PATENT DOCUMENTS

2011/0123184 A1* 5/2011 Mather ............... H04N 5/2256
396/176

\* cited by examiner

*Primary Examiner* — Thomas M Sember

(57) ABSTRACT

A flash illumination device for use with an electronic apparatus is provided and includes a connection unit and at least one organic light-emitting diode unit. The electronic apparatus includes a video shooting component or a display screen. The connection unit electrically connects with the electronic apparatus. The organic light-emitting diode unit is coated on a lateral surface of the connection unit and electrically connected to the electronic apparatus through the connection unit. The organic light-emitting diode unit starts under the control of the electronic apparatus and emits instantaneous light or persistent light, which is conductive to low power consumption and characterized by surface emission, while the video shooting component is capturing an image, so as to provide supplemental lighting.

11 Claims, 10 Drawing Sheets

FLASH ILLUMINATION DEVICE FOR USE WITH ELECTRONIC APPARATUS OR MOBILE DEVICE

BACKGROUND OF THE INVENTION

1. Field of the Invention

The present invention relates to illumination devices, and more particularly, to a flash illumination device for use with mobile related electronic products to provide illumination which simulates natural light in order to be acceptable to the human eyes. The flash illumination device is energy-efficient, compact, flexible, diverse in shape, and capable of surface emission typical of an organic light-emitting diode.

2. Related Art

Mobile electronic products evolve by leaps and bounds, from desktop personal computer, notebooks, digital cameras, tablet pad computers, to smartphones, providing ever-changing functions. Mobile electronic products not only provide wireless communication but are also capable of taking pictures and shooting videos. The emergence of social networking websites and social networking applications brings about a phenomenon, that is, most mobile electronic product users can take pictures and shoot videos with mobile electronic products and upload the pictures and videos to social networking websites. Hence, the functionality and quality of picture taking and video shooting is of vital importance to electronic products nowadays.

The camera lens of each early mobile phone does not come with a flash; as a result, pictures taken with early mobile phones in a dim environment are seldom clear. However, with light-emitting diodes becoming more sophisticated, a light-emitting diode is disposed beside the lens of mobile phones of today to serve as a flash typically configured to operate in automatic, off, and on modes. Taking pictures with a flash is confronted with a problem, that is, the light-emitting diode which serves as the flash consumes a certain amount of electrical power otherwise available to the mobile phone. Hence, a conventional light-emitting diode which serves as a flash is likely to use up all the electrical power of the mobile phone after several instances of operation. In addition, light is emitted from a light-emitting diode instantaneously and in a point-emitting manner; as a result, the light emitted from a light-emitting diode is not only unfit for supplemental lighting but also occurs only at the instant of flashing. Furthermore, LED light-emitting diodes differ from sunlight in color temperature and color spectrum, and thus the light emitted from light-emitting diodes are greatly distorted and unnatural even if it were conducive to supplemental lighting. Although LED light-emitting diodes generate light as a supplemental source, its physical property is very different from the natural light source. Light-emitting diodes is a point light source, it provides incomparable narrow-band light character with natural light; therefore, while preparing LED flash, such LED device unit needs a more complicated additional structural backlight modules or some extra lenses in order to provide enough light intensity for consistency in order to overcome such natural disadvantage. As a result, not only must light-emitting diodes be mounted on something thick to thereby garner more weight and thickness, but light-emitting diodes also require an intricate manufacturing process and assembly process and thus incur much manufacturing costs; in view of this, light-emitting diodes are not the best source of light. On the other hand, plenty conventional materials which light-emitting diodes are made of natural raw materials found on the Earth, mainly rare earth materials or inorganic elements. As time goes by, the Earth is going to run out of natural resources.

As mentioned before, a light-emitting diode disposed at a mobile phone can serve as a flashlight, though the light-emitting diode consumes electrical power and, after operating for just a short while, actually consumes much electrical power otherwise available to the mobile phone or a connected electronic device, and in consequence users have to charge the light-emitting diode more often in order to render the light-emitting diode operable. Also, a single light-emitting diode disposed at the mobile phone is obviously not bright enough to provide optimal illumination and broad illumination. Furthermore, the point-emission of a light-emitting diode is too strong to be seen directly with the naked eye, otherwise the watchers will not only have their pupil contracted instantly to thereby perceive dark images and residual images but also suffer eventually from poor accommodation of lens or retinopathy, thereby ending up with visual impairment. Evidently, attempting to imitate the natural light source, light-emitting diodes do not provide the best solution to human beings' demand for illumination, not to mention that the blue light emitted from light-emitting diodes is harmful to the human eyes.

SUMMARY OF THE INVENTION

A flash illumination device for use with an electronic apparatus or a mobile device provides low-power-consumption, surface-emitting, and spontaneous instantaneous light or persistent light for use in supplemental lighting while the electronic apparatus is taking pictures so as to extend the duration in which electrical power is supplied to the electronic apparatus.

The flash illumination device emits light by means of an organic light-emitting diode and is capable of wireless transmission and charging. The flash illumination device is subjected to remote control exercised by an electronic apparatus to thereby control spectral curves of a spectrum of three primary colors; hence, the flash illumination device not only emits light which approximates natural light but also takes on regular, irregular, and bent shapes as needed, either in two-dimensional or three-dimensional.

The flash illumination device for use with an electronic apparatus or a mobile device according to the present invention comprises: a connection unit electrically connected to the electronic apparatus; and at least one organic light-emitting diode unit disposed on a lateral surface of the connection unit and electrically connected to the electronic apparatus through the connection unit, wherein the organic light-emitting diode unit is operated under control of the electronic apparatus to emit instantaneous light for use in supplemental lighting, thereby allowing the video shooting component to capture an image.

In one aspect of the present invention, the connection unit is built in with a wireless transmission module for sending and receiving signals between the flash illumination device and the electronic apparatus via the wireless transmission technology, thus the electronic apparatus exercises remote wireless control over the organic light-emitting diode unit.

The flash illumination device of the present invention is characterized in that: an organic light-emitting diode unit is coupled to a connection unit and then disposed in an electronic apparatus or is operating in a standalone manner to emit instantaneous light or persistent light under the control of the electronic apparatus at a high response speed, energy-efficiently, and in a way characterized by surface emission and a high degree of flexible bendability, so as to overcome the drawbacks of prior art, that is, a conventional magnesium flash or light-emitting diode has a low response speed and thus leads to the following disadvantages: late supplemental lighting, high power consumption of the electronic apparatus, point emission restricted to local weak lighting, and necessitating thickness constituent components of the light-emitting diode.

DETAILED DESCRIPTION OF THE INVENTION

Figure 1:
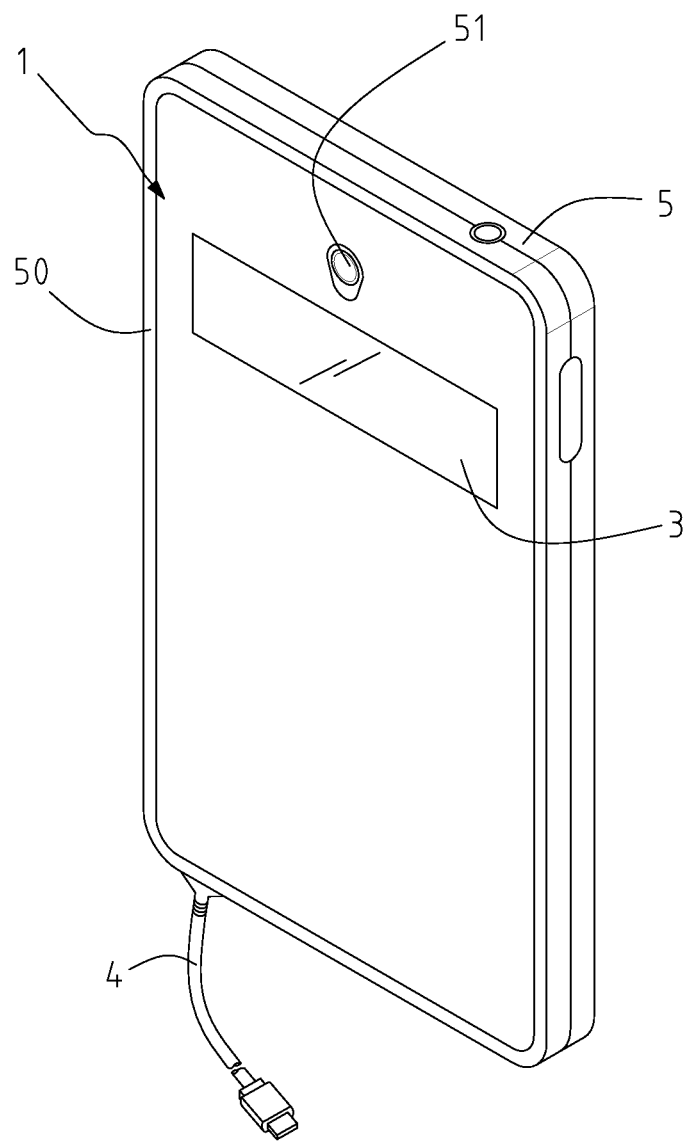
FIG. 1 is a perspective view of a flash illumination device for use with an electronic apparatus according to the present invention.
Figure 2:
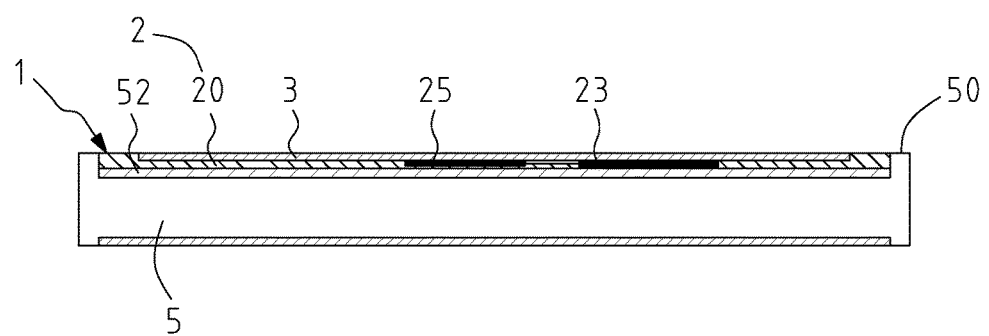
FIG. 2 is a cross-sectional view with reference to FIG. 1.
Figure 3:
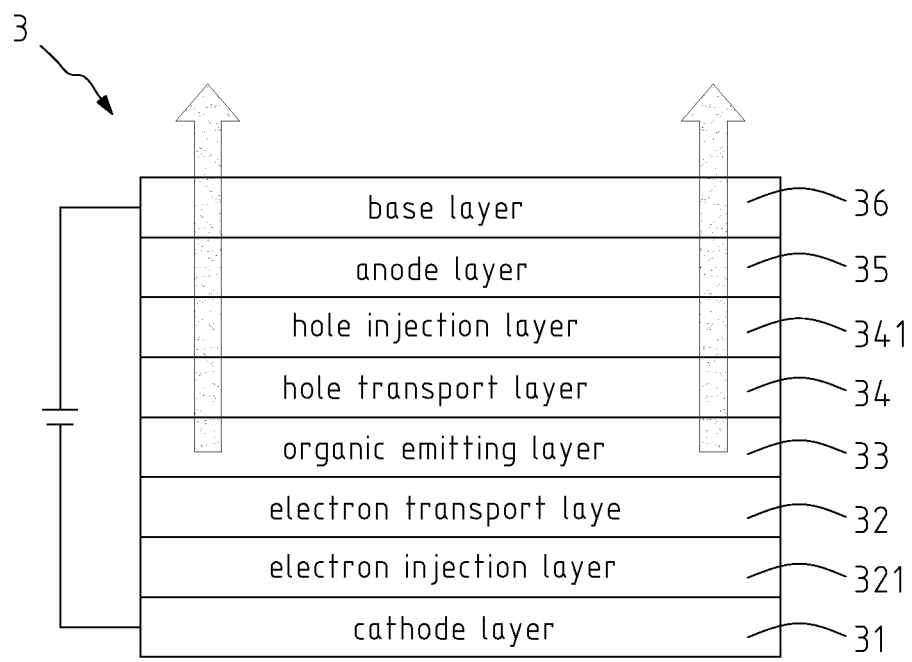
FIG. 3 is a schematic view of the physical structure of an organic light-emitting diode unit according to the present invention.

Referring to FIG. 1 through FIG. 3, there are shown diagrams of the first preferred embodiment of the present invention. The present invention provides a flash illumination device 1 for use with an electronic apparatus 5 or a mobile device. The electronic apparatus 5 is a smartphone or a tablet. The electronic apparatus 5 is built in with a display screen (not shown) and a video shooting component 51 which has a lens for use in taking pictures and shooting videos. The primary objective of the flash illumination device 1 of the present invention is to function as a flash for emitting instantaneous or persistent light while picture taking or video shooting is underway so as to provide supplemental lighting.

According to the present invention, the flash illumination device 1 for use with an electronic apparatus comprises a connection unit 2 and at least one organic light-emitting diode (OLED) unit 3. The organic light-emitting diode unit 3 is coated on a lateral surface of the connection unit 2 and electrically connected to the electronic apparatus 5 through the connection unit 2. According to the present invention, the organic light-emitting diode unit 3 is a white-light active organic light-emitting diode with a chemical component structure which comprises a cathode layer 31, an electron transport layer 32, an organic emitting layer 33, a hole transport layer 34, an anode layer 35, and a base layer 36 (shown in FIG. 3) arranged in sequence. The cathode layer 31 functions as a cathode preferably made of a metal material of a low work function to not only enable injection of electrons but also allow the cathode layer 31 to be directly disposed on the connection unit 2. The anode layer 35 functions as an anode preferably made of a metal material of a high work function to enhance the efficiency of injection of holes. Hence, the anode layer 35 is preferably made of a transparent material, that is, indium tin oxide (ITO) conductive glass, and disposed on the base layer 36. The base layer 36 is made of a transparent material. Moreover, in a preferred embodiment, an electron injection layer 321 is disposed between the cathode layer 31 and the electron transport layer 32, whereas a hole injection layer 341 is disposed between the hole transport layer 34 and the anode layer 35. The organic emitting layer 33 comprises a red region 331, a green region 332 and a blue region 333 which correspond to three primary colors of a spectrum, respectively, such that the three primary colors mix to generate a white light which approximates the natural light.

In this embodiment, the connection unit 2 is flat panel-shaped and adapted to contain the organic light-emitting diode unit 3 and serve as a medium for use in signal communication and power transmission with the electronic apparatus 5. Referring to FIG. 1 and FIG. 2, the connection unit 2 is disposed in the electronic apparatus 5. The electronic apparatus 5 is a smartphone. The electronic apparatus 5 has a backboard 50 built in with a preservation portion for engaging with or adhering to the organic light-emitting diode unit 3. The connection unit 2 has a control module 25 and a conducting component 23 coupled to the control module 25. The conducting component 23 is electrically connected to a circuit board 52 (shown in FIG. 2) of the electronic apparatus 5 (i.e., a smartphone) and thus adapted to perform signal communication and power transmission with the electronic apparatus 5 and supply power to the organic light-emitting diode unit 3, wherein the electronic apparatus 5 is charged by an external power source connected to the electronic apparatus 5 through a transmission line 4. Moreover, an application 53 is installed on the electronic apparatus 5 and adapted to adjust the shade, chromatic aberration and color temperature of the three primary R/G/B colors of the spectrum through the control module 25, thereby controlling variation in spectral curves. Hence, the application 53 sets related parameters pertaining to flashing during a picture taking process and during a video shooting to thereby provide variable supplemental lighting. When the electronic apparatus starts its active flashing or compulsory flashing function, once the picture taking process begins, the organic light-emitting diode unit 3 of the flash illumination device 1 can emit full-surface organic light instantaneously as soon as a shutter-release button is pressed, so as to provide supplemental lighting instantly, brightly and energy-efficiently. In addition, the supplemental lighting is optimized whenever the shutter and aperture are set in a way to provide persistent light. Moreover, the flash illumination device 1 illuminates the electronic apparatus 5 and thus functions as a flashlight. Compared with conventional light-emitting diodes (LEDs), the organic light-emitting diode unit 3 of the present invention consumes much less power and thus reduces the power consumption of the electronic apparatus 5; hence, the electronic apparatus 5 can provide broad illumination for a long period of time. By contrast, conventional LEDs have the following drawback: multiple LED lamps must be deployed and distributed across a fixed area in order to provide large-area point-emitting illumination; the requirement of multiple LED lamps instead of a single LED lamp increases the power consumption of the electronic apparatus 5 greatly and thus the electronic apparatus 5 uses up all its power in a very short period of time, thereby compromising the other functions of the electronic apparatus 5 (for example, functioning as a mobile phone).

Figure 4:
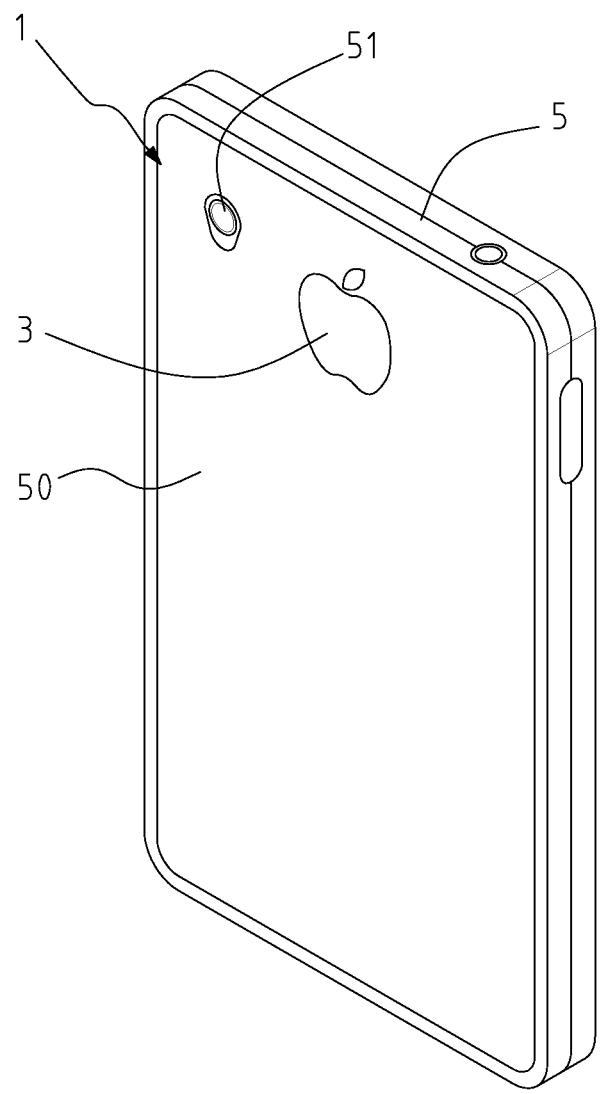
FIG. 4 is a front view of a preferred embodiment of the present invention.
Figure 5:
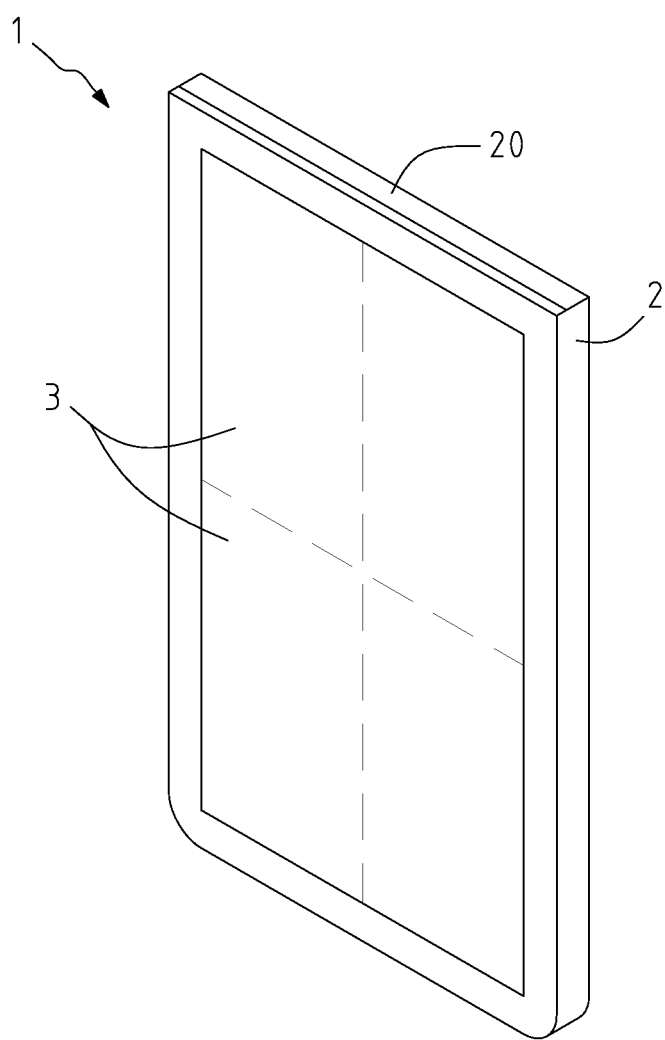
FIG. 5 is a front view of another preferred embodiment of the present invention.
Figure 9:
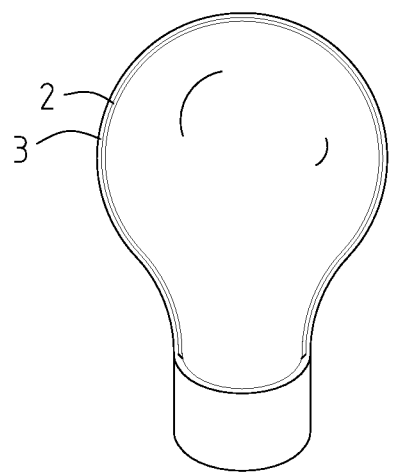
FIG. 9 is a perspective view of another preferred embodiment of the present invention.

FIG. 4 depicts a preferred embodiment of the flash illumination device 1, wherein the outline of the organic light-emitting diode unit 3 can be customized to be regular or irregular by coating, printing, etching, and cutting, and in consequence has a specific distinct pattern, irregular geometric shape or trademark pattern, wherein the whole area of the pattern can emit light. By contrast, conventional LEDs cannot form any specific pattern for allowing the whole pattern to emit light spontaneously; as a result, conventional LEDs can only provide illumination by means of backlight. In another preferred embodiment (shown in FIG. 9), the organic light-emitting diode unit 3 is coated around a spherical lamp to provide multiple-angle and multiple-surface lighting. Moreover, the organic light-emitting diode is capable of emitting light spontaneously, and usually has a required display module vertical thickness of less than 2 mm, based on the extra thin thickness character as Å unit only for coated layers, i.e., very thin and lightweight advantageously, and thus gets in line with the current trend toward compactness. Referring to FIG. 5, with considerations being given to diverse and large-area ways of shaping, the organic light-emitting diode unit 3 is not only coated on a substrate in one single instance but is also coated or plated across various different piece units each of small area in several instances to adjoin and to combine each piece unit and thus form a complete light-emitting surface of a larger area by patching.

Figure 6:
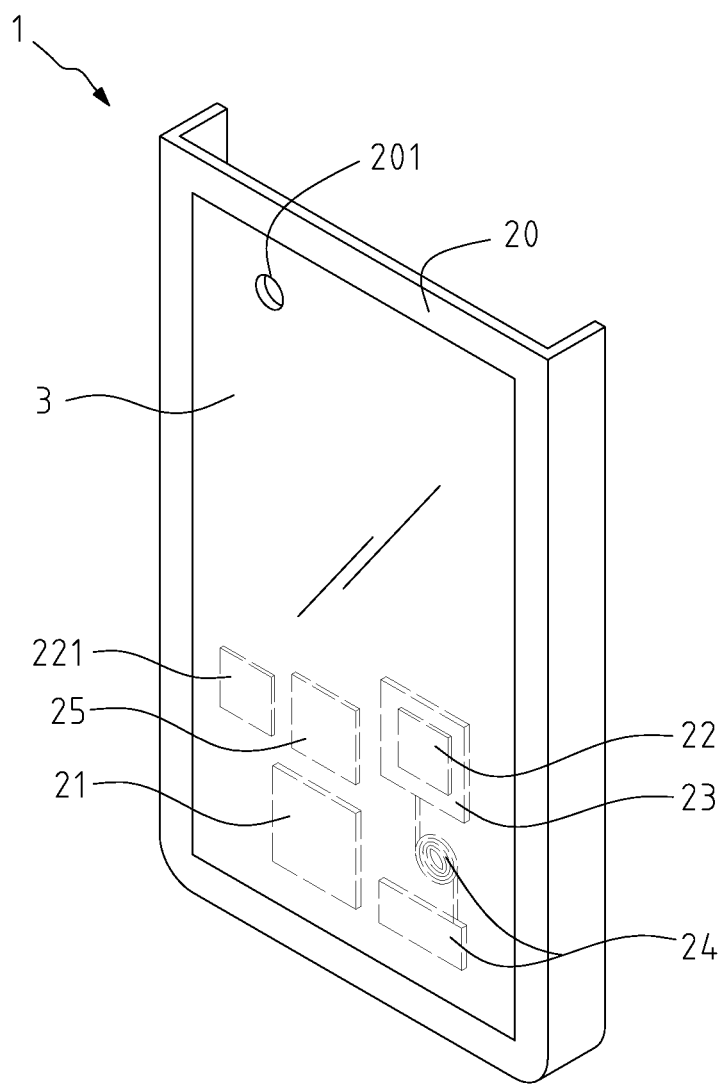
FIG. 6 is a perspective view of the second preferred embodiment of the present invention.
Figure 7:
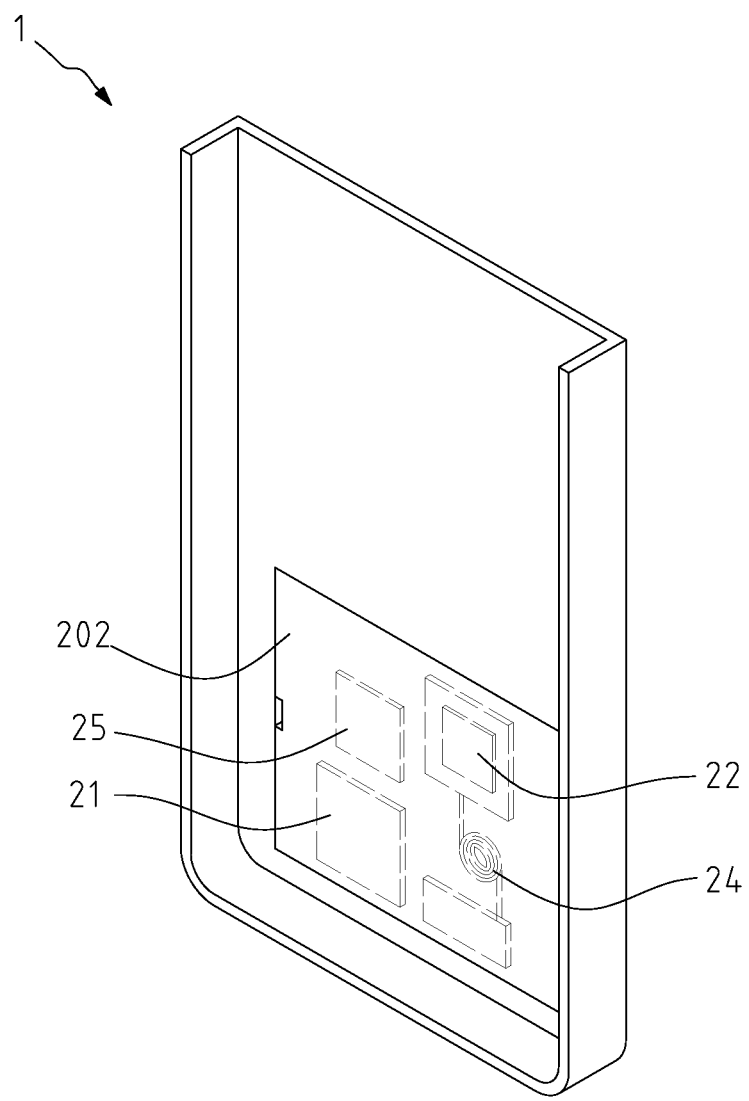
FIG. 7 is another perspective view of the second preferred embodiment of the present invention.

FIG. 6 is a perspective view of the second preferred embodiment of the present invention. As shown in FIG. 6, the flash illumination device 1 is standalone rather than disposed built-in in the electronic apparatus 5. In other words, the flash illumination device 1 shown in FIGS. 5 and 6 are standalone to be used under control of the electronic apparatus 5, without being physically and directly connected to the electronic apparatus 5. In FIG. 6, the connection unit 2 is frame-shaped as a protective case and fits around the electronic apparatus 5 to not only provide additional protection to the electronic apparatus 5 but also enhance its flashing illumination function. The connection unit 2 comprises a substrate 20 with its left, right, and bottom edges bending to extend forward and thus forming a receiving space for receiving the electronic apparatus 5. In this embodiment, the dimensions of the substrate 20 are predetermined according to the brand and model number of the electronic apparatus 5 (such as a mobile device, smartphone, digital camera, etc.), wherein a corresponding hole 201 is disposed at the top end of the substrate 20 and corresponds in position to a lens of the video shooting component 51 of the electronic apparatus 5. Alternatively, the substrate 20 is shorter than the electronic apparatus 5 to therefore stay away from the lens of the video shooting component 51; hence, the substrate 20 can be fully plate-shaped and need not have the corresponding hole 201. Since the flash illumination device 1 is standalone, its operation with the electronic apparatus 5 is effectuated by wireless transmission technology. A wireless transmission module 21, a power supply unit 22, the conducting component 23, a wireless charging module 24, and the control module 25 are embedded in the substrate 20 and coupled to each other. One side of the organic light-emitting diode unit 3 is disposed on a surface of the substrate 20, whereas another side of the organic light-emitting diode unit 3 emits light outward. Additionally, the substrate 20 can be further provided with an organic/inorganic type solar cell charging module 221 therein which is electrically connected to the power supply unit 22 and adapted to charge the power supply unit 22 through the solar energy.

In another preferred embodiment illustrated with FIG. 5, the flash illumination device 1 is standalone rather than disposed in the electronic apparatus 5, as mentioned above. The connection unit 2 is flat and can be separated from the electronic apparatus 5. The connection unit 2 comprises the substrate 20 to thereby form a delicate plane, either as a soft flexible one or a hard rigid. In this embodiment, the dimensions of the substrate 20 are predetermined according to the need for flashing and the strength of flashing, wherein the substrate 20 is fully plate-shaped and thus not only easy to carry but also suitable for being placed around mobile devices to enhance supplemental lighting. Since the flash illumination device 1 is standalone, its communication with the electronic apparatus 5 is effectuated by wireless transmission technology. Likewise, a wireless transmission module 21, a power supply unit 22, a conducting component 23, a wireless charging module 24 and a control module 25 are embedded in the substrate 20 and coupled to each other. One side of the organic light-emitting diode unit 3 is disposed on at least one surface of the substrate 20 to emit light outward.

Figure 8:
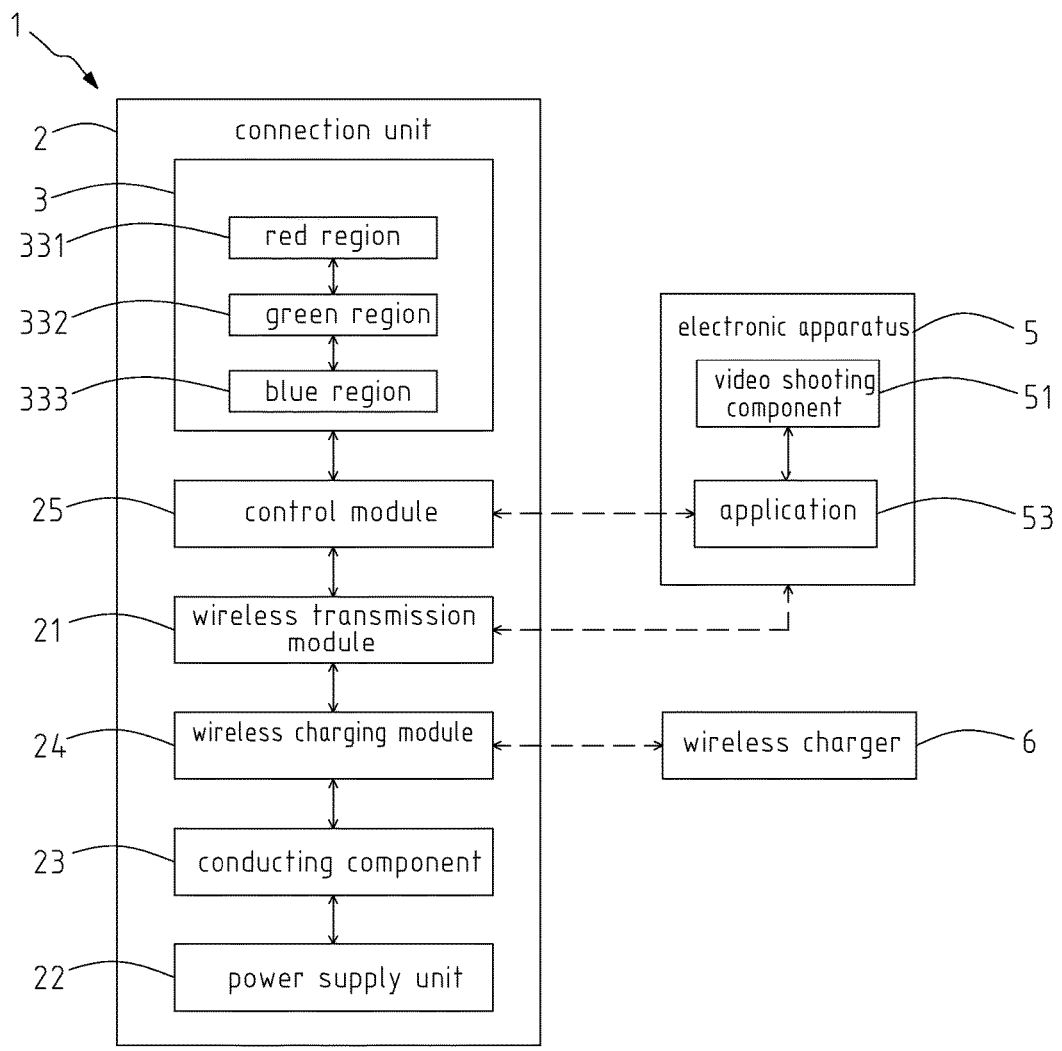
FIG. 8 is a function block diagram of the flash illumination device for use with an electronic apparatus according to the present invention.
Figure 8:
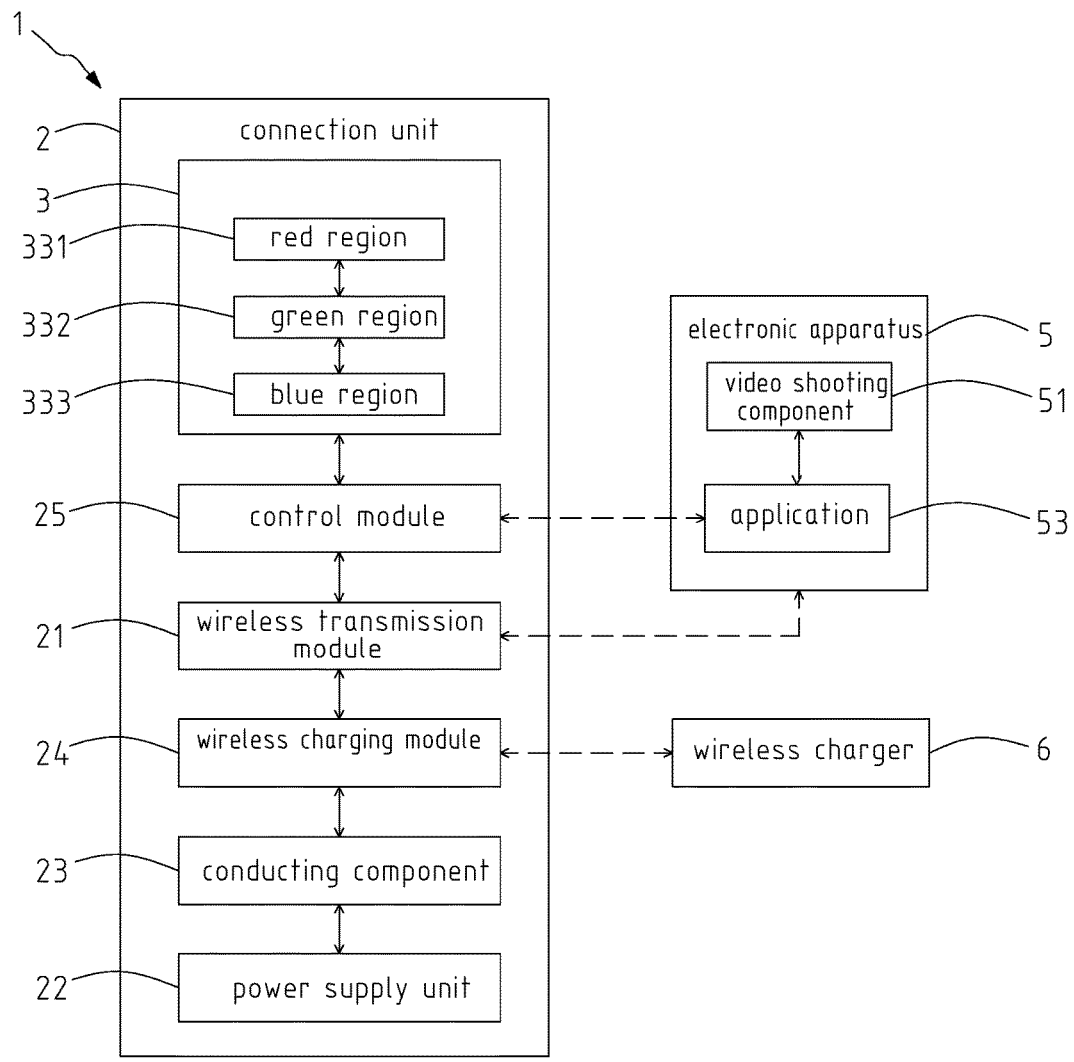

As mentioned before, one end of the conducting component 23 is connected to the power supply unit 22, whereas another end of the conducting component 23 is connected to the organic light-emitting diode unit 3. The conducting component 23 is a printed circuit layer, either flexible or non-flexible. The power supply unit 22 is a rechargeable battery, such as a thin lithium battery or a solar cell to be connected, for supplying power to the organic light-emitting diode unit 3. According to the present invention, the wireless transmission module 21 of the flash illumination device 1 is adapted to send and receive signals generated from the electronic apparatus 5 by wireless transmission technology, such as Wi-Fi, Bluetooth, Infrared, or radio. Hence, a user can exercise wireless remote control over the flash illumination device 1 through the electronic apparatus 5 to, for example, turn on or turn off the flash illumination device 1 and set related parameters of flashing or light emission. Referring to FIG. 8, there is shown a function block diagram of the flash illumination device 1 of the present invention. A signal from the electronic apparatus 5 (such as a mobile phone) is received by the wireless transmission module 21 and then immediately sent to the control module 25 to enable the control module 25 to drive the organic light-emitting diode unit 3 to generate the required light or change the shade, color temperature and chromatic aberration or the duration of light emission. The control module 25 is an integrated circuit.

With the flash illumination device 1 being standalone, a wireless charging module 24 is embedded in the substrate 20 and electrically connected to a power supply unit 22. The wireless charging module 24 has a conventional typical structure and essentially comprises a metal coil and a circuit board. The wireless charging module 24 charges the power supply unit 22 by effectuating induction with a wireless charger 6 (shown in FIG. 8). Moreover, an access door 202 is disposed at the substrate 20, faces away from the organic light-emitting diode unit 3, and corresponds in position to the power supply unit 22 inside the substrate 20. The access door 202 renders the substrate 20 accessible and can be removed from the substrate 20, thereby allowing the power supply unit 22 (such as a thin lithium battery or a solar cell to be connected) to be changed.

Figure 10:
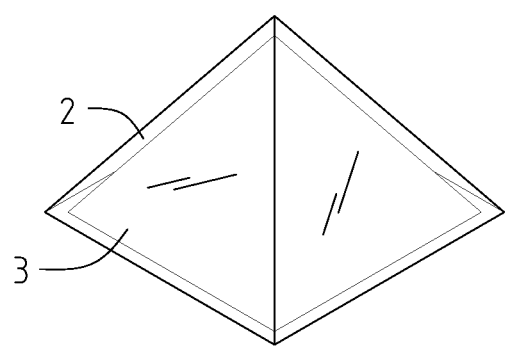
FIG. 10 is a perspective view of another preferred embodiment of the present invention.

As described before, according to the present invention, since the flash illumination device 1 is standalone when implemented, signal communication between the flash illumination device 1 and the electronic apparatus 5 occurs by wireless transmission, and thus the application of the flash illumination device 1 is not restricted to a single electronic apparatus; instead, multiple said electronic apparatuses 5 can exercise remote control over the flash illumination device 1 to achieve a one-to-many operation mode; including one electronic apparatus can remote control over various flash illumination device 1 at the same time. The flash illumination device 1 is placed wherever supplemental lighting is required and at a distance away from the user so as to emit flashing or persistent light under the remote control of the electronic apparatus 5 held in the user's hand while picture taking or video shooting is underway. Alternatively, the flash illumination device 1 provides active light (i.e., a flashlight), and the shade, color temperature and chromatic aberration of the light emitted from the organic light-emitting diode unit 3 can be adjusted by the application 53 of the electronic apparatus 5 as needed. In particular, based on the property of the organic light-emitting diode is flexible and bendable, if the substrate 20 is bendable, the organic light-emitting diode unit 3 is bendable too. Once the organic light-emitting diode unit 3 is coated and distributed on the substrate 20, the organic light-emitting diode unit 3 will take on irregular shape to thereby appear in irregular form or upright form, covering from two-dimensional to three-dimensional (shown in FIG. 9 and FIG. 10).

In conclusion, according to the present invention, the flash illumination device 1 comprises the organic light-emitting diode unit 3 and the connection unit 2 which are coupled together and thus can be either disposed in the electronic apparatus 5 or standalone to emit instantaneous light or persistent light under the control of the electronic apparatus 5 at a high response speed, energy-efficiently, and in a way characterized by planar surface emission and a high degree of bendability and flexibility, so as to overcome the drawbacks of prior art, that is, a conventional magnesium flash or LED has a low response speed and thus leads to the following disadvantages: late supplemental lighting, high power consumption of the electronic apparatus, point emission restricted to local weak lighting, the high likelihood that the overly strong emitted light causes visual impairment, and the fact that the LED is structurally much thicker than OLED to the detriment of the thinning design of the electronic apparatus 5.

It is understood that the invention may be embodied in other forms within the scope of the claims. Thus the present examples and embodiments are to be considered in all respects as illustrative, and not restrictive, of the invention defined by the claims.

What is claimed is:

1. A flash illumination device for use with an electronic apparatus or a mobile device, comprising:
   a connection unit electrically connected to the electronic apparatus; and
   at least one organic light-emitting diode unit disposed on a lateral surface of the connection unit and electrically connected to the electronic apparatus through the connection unit,
   wherein the organic light-emitting diode unit is operated under control of the electronic apparatus to emit instantaneous light for use in supplemental lighting, thereby allowing the electronic apparatus or the mobile device to capture an image, the connection unit is built in with a wireless transmission module for sending and receiving signals between the flash illumination device and the electronic apparatus via the wireless transmission technology, thus the electronic apparatus exercises remote wireless control over the organic light-emitting diode unit.

2. The flash illumination device of claim 1, wherein the connection unit is coated with a plurality of said organic light-emitting diode units adjoining for bonding each other to form a complete light-emitting surface by patching the organic light-emitting diode units.

3. The flash illumination device of claim 1, wherein the connection unit comprising a substrate which a power supply unit and a conducting component are embedded in, wherein an end of the conducting component is connected to the power supply unit, and another end of the conducting component is connected to the organic light-emitting diode unit, so as to supply power to the organic light-emitting diode unit.

4. The flash illumination device of claim 3, wherein the substrate further comprises a wireless charging module electrically connected to the power supply unit and adapted to wirelessly charge the power supply unit through a wireless charger.

5. The flash illumination device of claim 3, wherein the substrate further comprises an organic/inorganic type solar cell charging module electrically connected to the power supply unit and adapted to charge the power supply unit through the solar energy.

6. The flash illumination device of claim 1, wherein the organic light-emitting diode unit has a chemical component structure which comprises a cathode layer, an electron transport layer, an organic emitting layer, a hole transport layer, an anode layer, and a base layer arranged in sequence.

7. The flash illumination device of claim 6, wherein the organic emitting layer comprises a red region, a green region, and a blue region which correspond to three primary colors of a spectrum, respectively, and an application is installed on the electronic apparatus to adjust shade, chromatic aberration, and color temperature of the three primary colors of the spectrum, thereby controlling variation in spectral curves.

8. The flash illumination device of claim 1, wherein the organic light-emitting diode unit emits persistent light under control of the electronic apparatus.

9. The flash illumination device of claim 1, wherein the electronic apparatus comprises a video shooting component and a display screen so that the flash illumination device offers the supplemental light while working together with the electronic apparatus or the mobile device.

10. A flash illumination device for use with an electronic apparatus or a mobile device, comprising:
    a connection unit electrically connected to the electronic apparatus; and
    at least one organic light-emitting diode unit disposed on a lateral surface of the connection unit and electrically connected to the electronic apparatus through the connection unit,
    wherein the organic light-emitting diode unit is operated under control of the electronic apparatus to emit instantaneous light for use in supplemental lighting, thereby allowing the electronic apparatus or the mobile device to capture an image, the connection unit is frame-shaped and has a corresponding hole, wherein the connection unit fits around a side of the mobile device to further function as a protective case of the mobile device, wherein the corresponding hole corresponds in position to a lens of a video shooting component of the mobile device, and the organic light-emitting diode unit emits light.

11. A flash illumination device for use with an electronic apparatus or a mobile device, comprising:
- a connection unit electrically connected to the electronic apparatus; and
- at least one organic light-emitting diode unit disposed on a lateral surface of the connection unit and electrically connected to the electronic apparatus through the connection unit,
- wherein the organic light-emitting diode unit is operated under control of the electronic apparatus to emit instantaneous light for use in supplemental lighting, thereby allowing the electronic apparatus or the mobile device to capture an image, the connection unit is flexible, and the organic light-emitting diode unit bends as the connection unit bends to take on two-dimensional and three-dimensional irregular shapes.

\* \* \* \* \*